United States Patent
Moyer

(10) Patent No.: US 6,215,707 B1
(45) Date of Patent: Apr. 10, 2001

(54) CHARGE CONSERVING WRITE METHOD AND SYSTEM FOR AN MRAM

(75) Inventor: William C. Moyer, Dripping Springs, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/546,367

(22) Filed: Apr. 10, 2000

(51) Int. Cl.$^7$ .............................. G11C 16/04; G11C 11/15
(52) U.S. Cl. ...................... 365/189.07; 365/173; 365/171
(58) Field of Search .............................. 365/189.07, 173, 365/171, 158, 49, 50

(56) References Cited

U.S. PATENT DOCUMENTS

| | | | |
|---|---|---|---|
| 5,329,480 | * 7/1994 | Wu et al. | 365/170 |
| 5,396,455 | * 3/1995 | Brady et al. | 365/170 |
| 5,587,943 | * 12/1996 | Torok et al. | 365/158 |
| 5,917,749 | * 6/1999 | Chen et al. | 365/173 |
| 5,926,414 | * 7/1999 | McDowell et al. | 365/170 |
| 5,936,882 | * 10/1999 | Dunn | 365/158 |
| 6,052,302 | * 4/2000 | Moyer et al. | 365/173 |
| 6,097,626 | * 8/2000 | Brug et al. | 365/171 |

* cited by examiner

Primary Examiner—Vu A. Le
Assistant Examiner—Anh Phung

(57) ABSTRACT

A charge conserving write method and apparatus to reduce average write current in integrated circuit (IC) magnetoresistive random access memory (MRAM) systems. In a first embodiment, a selected one of a pair of current switches, each connected between respective ends of a selected pair of bit-lines, are enabled to concatenate the selected bit-lines so that a single bit-write-current simultaneously writes the respective bit cells in bot bit-lines. In a second embodiment, the current switches and the bit-write driver circuits of the selected bit-lines are selectively enabled to balance the average utilization of the drivers. Both single-ended and bi-directional driver embodiments are disclosed.

10 Claims, 1 Drawing Sheet

CHARGE CONSERVING WRITE METHOD AND SYSTEM FOR AN MRAM

CROSS REFERENCE TO RELATED APPLICATIONS

The present invention is related to the following applications for patents:

"BIT-WISE CONDITIONAL WRITE METHOD AND SYSTEM FOR AN MRAM" by William C. Moyer, et al., application Ser. No. 09/406,425, filed Sep. 27, 1999, now U.S. Pat. No. 6,052,302 and assigned to the assignee hereof; and "MRAM CAM" by William C. Moyer, application Ser. No. 09/406,415, filed Sep. 27, 1999, current pending, and assigned to the assignee hereof.

FIELD OF THE INVENTION

The present invention relates to integrated circuit (IC) magnetoresistive random access memory (MRAM) systems, and, more specifically, to a write method for minimizing power consumption in an IC MRAM system.

BACKGROUND OF THE INVENTION

Although during the Fifties and Sixties magnetic core memories were the predominant storage technology for the working memory of computing systems, they were rapidly supplanted during the Seventies by the integrated circuit random access memory, both static (SRAM) and dynamic (DRAM). The advantages of these newer technologies are well known: microscopic size (contributing to higher operating speeds), miniscule power requirements (requiring dissipation of less waste heat), improved robustness and thus reliability, and manufacturing efficiencies of scale—all of which contributed to the dramatically reduced cost per bit. The disadvantages are equally well known: data volatility, reflected as continuous power dissipation in SRAMs, and as periodic data refresh in DRAMs. To address these problems, various types of non-volatile, read/write memory technologies have been developed, including electrically erasable programmable read only memory (EEPROM), of which Flash memory is, at present, the most popular. All such technologies, however, have additional disadvantages, including finite lifetimes (in terms of write cycles), and power supply requirements which challenge designers of battery powered systems.

Recently, magnetoresistive random access memory (MRAM) cells suitable for fabrication using current integrated circuit manufacturing processes have been developed for use as non-volatile storage elements. Examples of such an MRAM cell suitable for implementation in an IC are shown and described in U.S. Pat. Nos. 5,343,422, 5,917,749, and 5,920,500. A survey of current MRAM technologies and their relative advantages and disadvantages was published by R. Scheuerlein in "Magneto Resistive IC Memory Limitations and Architecture Implications", 1998 International Non Volatile Memory Technology Conference, IEEE, pp. 47–50 (1998).

In general, MRAM devices of the Magnetic Tunnel Junction (MTJ) type include a multi-layer resistor element comprised of suitable magnetic materials which change its resistance to the flow of electrical current depending upon the direction of magnetic polarization of the layers. In a memory cell, this "bit_resistor" is connected in series with a "bit_read" transistor between a common voltage supply and a "bit_read_write" conductor connected to an input of a "read" sense amplifier. A "word_write" conductor is arranged to intersect, relatively orthogonally, the bit_read_write conductor. The word_write and the bit_read_write conductors are connected to respective word_write and bit_write driver circuits which are selectively enabled such that each conductor conducts only a portion of the current necessary to switch the polarization state of the bit_resistor.

During a write operation, each of these "write" currents is generally insufficient to affect the polarization state of any bit_resistor, but, together, at the point of intersection or "coincidence", the currents are sufficient to affect the polarization state of that bit_resistor which is proximate to the intersection of the write conductors. Depending upon the present state of polarization and the relative directions of current flow in the write conductors, the bit_resistor at the coincidence point will either maintain or switch its polarization state.

During a read operation, the bit_read transistor is enabled via a respective word_read conductor, and, simultaneously, the corresponding bit_read sense amplifier is enabled to create a current path from the bit_read_write conductor to the common supply. Since the difference in the resistance value of the bit_resistor is small, the bit_read sense amp must be sufficiently sensitive to recognize the small differences in voltage drop across the bit_resistor associated with the respective polarization states. As was the case with magnetic core memories, an MRAM bit_resistor, once written, will retain its magnetic polarization state indefinitely, with no further input of power. Similarly, there appears to be no practical limit on the number of times that the polarization of the bit_resistor itself can be switched or "written".

One of the unfortunate characteristics of such MRAM cells is the relatively large write currents required to switch the magnetic polarization of the bit_resistor. As improvements in process technologies decrease the cross-sectional area of the write conductors, metal migration effects become significant. This is particularly of concern as the number of bits being written simultaneously increases. Corresponding improvements are needed to reduce the average instantaneous write current.

It is an object of the present invention to provide a method for reducing the average instantaneous write current in an MRAM.

In addition, it is another object of the present invention to provide a system for practicing the method disclosed hereinafter.

BRIEF DESCRIPTION OF THE DRAWINGS

The present invention may be more fully understood by a description of certain preferred embodiments in conjunction with the attached drawings in which.

In the following descriptions of the several preferred embodiments of the present invention, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE PREFERRED EMBODIMENTS

Figure 1:
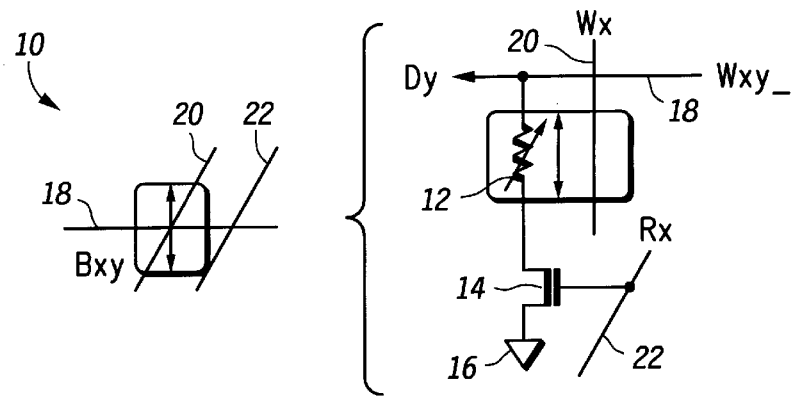
FIG. 1 illustrates in schematic diagram form a conventional magnetoresistive random access memory (MRAM) cell, and the symbology used hereinafter to describe the preferred embodiment of the present invention.

In a conventional IC MRAM cell 10, as shown by way of example in FIG. 1, a bit_resistor 12 is connected in series with a bit_read transistor 14 between a common voltage supply 16 and a bit_read_write conductor 18. A word_write conductor 20 is arranged to intersect, relatively orthogonally, the bit_read_write conductor 18. A word_read conductor 22 is connected to the control gate of the bit_read transistor 14.

In view of the conventional nature of the MRAM cell 10, the symbol shown in the left portion of FIG. 1 will be used hereinafter whenever the cell illustrated in the right portion of FIG. 1 is instantiated in the MRAM systems shown in FIG. 2. For convenience of reference, in FIG. 1, the left end of bit_read_write conductor 18 has been labeled "Dy" to indicate that, for example, it provides a path for reading "bit y" of a multi-bit "word x", while the right end has been labeled "Wxy_" to indicate that it also provides a path for the respective bit_write current. Similarly, the word_write conductor 20 and the word_read conductor 22 have been labeled respectively "Wx" and "Rx", to reflect the nomenclature used hereinafter.

Figure 2:
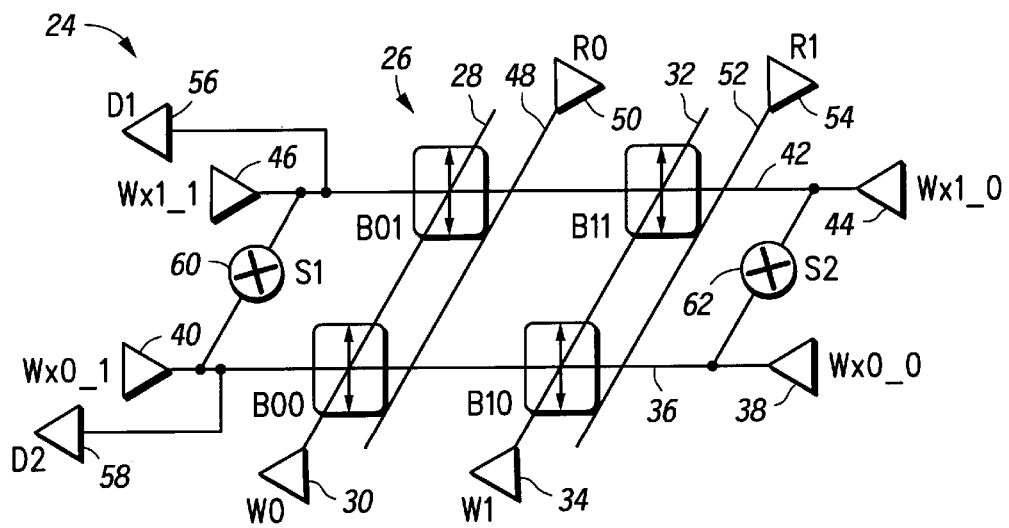
FIG. 2 illustrates in schematic diagram form an MRAM system constructed in accordance with a preferred embodiment of the present invention.

Shown in FIG. 2 is a MRAM system 24 in which Four (4) instantiations of the conventional MRAM cell 10 shown in FIG. 1 have been arranged to form an MRAM array 26 comprising Two (2) words, each consisting of Two (2) data bits, each labeled in accordance with FIG. 1 to indicate the logical position of the respective MRAM cell 10 in the MRAM array 26. In particular, a word_0 is comprised of a first MRAM cell 10, labeled "B00", representing a logical bit_0 of word_0 and a second MRAM cell 10, labeled "B01", representing a logical bit_1 of word_0; and a word_1 is comprised of a third MRAM cell 10, labeled "B10", representing a logical bit_0 of word_1 and a fourth MRAM cell 10, labeled "B11", representing a logical bit_1 of word_1. A word_0_write conductor 28, labeled "W0", is driven by a word_0_write driver circuit 30; and a word_1_write conductor 32, labeled "W1", is driven by a word_1_write driver circuit 34. A bit_0_read_write conductor 36, shared by bit_0 of both word_0 and word_1, is driven in one direction by a bit_0_write_0 driver circuit 38, labeled "Wx0_0", and in a second, opposite direction by a bit_0_write_1 driver circuit 40, labeled "Wx0_1 "; whereas a bit_1_read_write conductor 42, shared by bit_1 of both word_0 and word_1, is driven in one direction by a bit_1_write_0 driver circuit 44, labeled "Wx1_0", and in a second, opposite direction by a bit_1_write_1 driver circuit 46, labeled "Wx1_1".

During a conventional write operation of, for example, word_0, the word_0_write driver circuit 30 (W0) is enabled to provide a word_write current via the word_0_write conductor 28. If a data value of 0 is to be written to, for example, bit_0, the bit_0_write_0 driver circuit 38 (Wx0_0) will be simultaneously enabled to provide a bit_write current via the bit_0_read_write conductor 36. Each of these write currents is individually insufficient to affect the polarization state of the B00 MRAM cell 10, but, together, the "coincidence" currents are sufficient to force a predetermined one of the two polarization states. Depending upon the present state of polarization and the relative directions of current flow in the write conductors, the B00 MRAM cell 10 will either maintain or switch its polarization state. In similar fashion, the desired polarization state of the B01 MRAM cell 10 can be established by selectively enabling the appropriate one of the pair of bit_1_write driver circuits. It should be noted that, in a conventional MRAM system 24, at least one of each pair of bit_write driver circuits is enabled every write cycle.

Continuing with the MRAM system 24 of FIG. 2, a word_0_read conductor 48, labeled "R0", is driven by a word_0_read driver circuit 50; while a word_1_read conductor 52, labeled "R1", is driven by a word_1_read driver circuit 54. During a read operation of, for example, word_1, the word_1_read driver circuit 54 enables, for example, the B11 MRAM cell 10 to shunt current between the common supply and the bit_1_read_write conductor 42, and, simultaneously, a bit_1_1 sense_amplifier 56 is enabled to detect the relative level of the shunt current. Since the difference in the resistance value of the bit_resistor 12 of the B11 MRAM cell 10 is small, the bit_1_sense_amplifier 56 must be sufficiently sensitive to recognize the small differences in voltage drop across the bit_resistor 12 associated with the respective polarization states. In similar fashion, a bit_0_sense_amplifier 58 will detect the level of current flow on bit_0_read_write conductor 36 due to the state of the B10 MRAM cell 10.

It is, of course, apparent that the size of the MRAM array 26 is largely dependent upon the selected manufacturing process. However, as the number of bits comprising MRAM array 26 is increased, the required write drive currents increase rapidly. In accordance with the present invention, it is possible to reduce very significantly the average level of drive currents.

As shown in FIG. 2, a first current switch 60 is provided to selectively connect, in response to a signal S1, the "left" end of the bit_0_read_write conductor 36 to the "left" end of the bit_1_read_write conductor 42 to form a first folded bit line configuration. Similarly, a second current switch 62 is provided to selectively connect, in response to a signal S1, the "right" end of the bit_0_read_write conductor 36 to the "right" end of the bit_1_read_write conductor 42 to form a second folded bit line configuration. Preferably, switch 60 and switch 62 each comprise a full transmission gate, although in some embodiments, a single pass transistor of appropriate polarity may be sufficient.

In operation, the several control signals are produced as a function of the logic states of the input bits, I0 and I1, that are to be written into respective bit cells Bx0 and Bx1. One appropriate set of logic equations comprise the following:

| | |
|---|---|
| Wx0_0 = (I0 == 0) | ;I0 = 0 |
| Wx0_1 = (I0 == 1) | ;I0 = 1 |
| Wx1_0 = ((I0 == 0) && (I1 == 0)) | ;I0 = I1 = 0 |
| Wx1_1 = ((I0 == 1) && (I1 == 1)) | ;I0 = I1 = 1 |
| S1 = ((I0 == 0) && (I1 == 1)) | ;I0 = 0, I1 = 1 |
| S2 = ((I0 == 1) && (I1 == 0)) | ;I0 = 1, I1 = 0 | where:
  ==→equivalence,
  &&→logical AND,
  Wx→the particular word line to be written, e.g., W0 or W1,
  I0, I1→the particular input bits.

From these equations, it can be seen that whenever I0=0, then the bit_0_write_0 driver circuit 38 will be enabled to provide bit-write current on the bit_0_read_write conductor 36 to write a logic 0 into the Bx0 cell. If it happens that, in addition, I1=0, then the bit_1_write_0 driver circuit 44 will be enabled to provide bit-write current on the bit_1_read_write conductor 42 to write a logic 0 into the Bx1 cell. If, on the other hand, I1=1, then the bit_1_write_1 driver circuit 46 will be disabled. Instead, the switch 60 will be enabled to allow the bit-write current provided by the bit_0_write_0 driver circuit 38 on the bit_0_read_write conductor 36 to also flow down the bit_1_read_write conductor 42 in the proper direction to write a logic 1 into the Bx1 cell. In effect, the bit-write current used to write the logic 0 in Bx0 is also used to write the logic 1 into Bx1. Thus, assuming the probability of I0 and I1 being the same is less than One Hundred Percent (100), then the average current drawn by my improved MRAM system 24 will be less than in a prior art MRAM system.

In the set of logic equations set forth above, if I0 and I1 are different, then the only driver circuits that are used are the bit_0_write_0 driver circuit 38 and bit_0_write_1 driver circuit 40. In order to even out the utilization of the driver circuits, the following, improved set of logic equations can be used:

```
If (z)
  {
  Wx0_0 = (I0 == 0)                      ;I0 = 0
  Wx0_1 = (I0 == 1)                      ;I0 = 1
  Wx1_0 = ((I0 == 0) && (I1 == 0))       ;I0 = I1 = 0
  Wx1_1 = ((I0 == 1) && (I1 == 1))       ;I0 = I1 = 1
  S1 = ((I0 == 0) && (I1 == 1))          ;I0 = 0, I1 = 1
  S2 = ((I0 == 1) && (I1 == 0))          ;I0 = 1, I1 = 0
  }
Else
  {
  Wx1_0 = (I1 == 0)                      ;I1 = 0
  Wx1_1 = (I1 == 1)                      ;I1 = 1
  Wx0_0 = ((I0 == 0) && (I1 == 0))       ;I0 = I1 = 0
  Wx0_1 = ((I0 == 1) && (I1 == 1))       ;I0 = I1 = 1
  S1 = ((I0 == 1) && (I1 == 0))          ;I0 = 1, I1 = 0
  S2 = ((I0 == 0) && (I1 == 1))          ;I0 = 0, I1 = 1
  }
``` where:
==→equivalence,
&&→logical AND,
z→a random condition,
Wx→the particular word line to be written, e.g., W0 or W1,
I0, I1→the particular input bits.

From the improved set of equations, it can be seen that the roles of the driver circuits are randomly reversed, thus tending to balance their utilization. Any of a number of convenient criteria can be used as the random condition z. For example, one or the other of the input bits I0 or I1 could be used, or perhaps a logical function of both, say Exclusive OR. Alternatively, a user-settable control bit (not shown) could be provided, so that the "duty cycle" of the drivers may be varied in a predictable manner.

Figure 3:
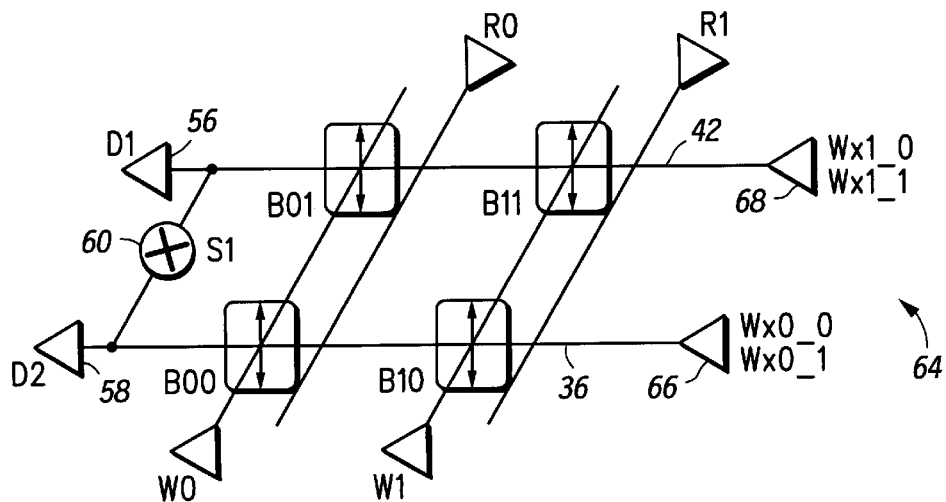
FIG. 3 illustrates in schematic diagram form an MRAM system constructed in accordance with an alternative embodiment of the present invention.

Shown in FIG. 3 is an MRAM system 64 constructed in accordance with an alternative embodiment of the present invention, wherein double-ended, push-pull drivers have been substituted for the single ended drivers shown in FIG. 2. Such bi-directional drivers, of which an example can be found in U.S. Pat. No. 5,491,656, are well known in the art. In operation, a bi-directional word_0_write_x driver 66 sources the bit_0_write_0 current on the bit_0_read_write conductor 36 in response to the Wx0_0 signal, and sinks the bit_0_write_1 current on the bit_0_read_write conductor 36 in response to the Wx0_1 signal; whereas a bi-directional word_1_write_x driver 68 sources the bit_1_write_0 current on the bit_1_read_write conductor 42 in response to the Wx1_0 signal, and sinks the bit_1_write_1 current on the bit_1_read_write conductor 42 in response to the Wx1_1 signal. In this configuration, there is no need for the switch 62 of FIG. 2. For clarity, the numbers have been omitted for all other elements which are the same as in FIG. 2.

In operation, the several control signals shown in FIG. 3 are produced as a function of the logic states of the input bits, I0 and I1, that are to be written into respective bit cells Bx0 and Bx1. One appropriate set of logic equations comprise the following:

```
If (z)
  {
  Wx0_0 = (I0 == 0)                      ;I0 = 0
  Wx0_1 = (I0 == 1)                      ;I0 = 1
  Wx1_0 = ((I0 == 0) && (I1 == 0))       ;I0 = I1 = 0
  Wx1_1 = ((I0 == 1) && (I1 == 1))       ;I0 = I1 = 1
  S1 = (I0 != I1)                        ;I0 != I1
  }
Else
  {
  Wx1_0 = (I1 == 0)                      ;I1 = 0
  Wx1_1 = (I1 == 1)                      ;I1 = 1
  Wx0_0 = ((I0 == 0) && (I1 == 0))       ;I0 = I1 = 0
  Wx0_1 = ((I0 == 1) && (I1 == 1))       ;I0 = I1 = 1
  S1 = (I0 != I1)                        ;I0 != I1
  }
``` where:
==→equivalence,
?=→not equal,
&&→logical AND,
z→a random condition,
Wx→the particular word line to be written, e.g., W0 or W1,
I0, I1→the particular input bits.

Although I have illustrated my invention in the context of an MRAM array having only a pair of word lines, each having only a pair of bit cells, it will be clear to those skilled in the art that my invention is applicable to arrays having any convenient numbers of words and bits-per-word. Furthermore, although I have shown and described the selective folding of only an adjacent pair of bit-lines, my invention can be easily extended to selectively fold any convenient number of bit-lines, which need not be adjacent. However, since the folded bit-lines will exhibit somewhat higher resistance and parasitic capacitance, the output current drive capacities of the driver circuits may need to be increased. As a result, there will be a practical limit as to the level of folding, perhaps no more than about Three (3) or so.

It should also be noted that, as in SRAMs, it is entirely possible to array the bit cells along sets of, logically independent "in line" bit-line segments, rather than in the illustrated "stacked" configuration. In such a configuration, the switches can be connected so as to selectively concatenate, for example, laterally-adjacent bit-line segments. Similarly, each of my bit-lines can themselves be folded such that all driver circuits are co-located in a column down the middle of the array with each pair of bit-lines arranged on either side of a respective pair of the drivers. Other, more complex configurations are also possible.

Thus it is apparent that there has been provided, in accordance with the present invention, a method for reducing average write current in an IC MRAM system. Those skilled in the art will recognize that modifications and variations can be made without departing from the spirit of the invention. In particular, although the present invention has been disclosed herein in the context of an MRAM system of the MTJ type, the invention is equally applicable to other types of MRAM systems, including Giant Magneto Resistive (GMR) and Anisotropic Magneto resistive (AMR). Therefore, it is intended that this invention encompass all such variations and modifications as fall within the scope of the appended claims.

What is claimed is:

1. In an integrated circuit (IC) magnetic random access memory (MRAM) system having at least one word consisting of first and second data bits, said first data bit comprising a first MRAM cell and said second data bit comprising a second MRAM cell, each of said cells being writeable in a selected one of a first and a second logic state in response to a coincidence of a word_write current and a bit_write current, wherein the logic state to which said cell is writeable is determined by the direction of said bit_write current, and wherein said bit_write current is provided in a first direction to write said data bit to said first logic state and in a second direction to write said data bit to said second logic state, a method comprising the steps of:

receiving first and second input bits, each having one of said first and second logic states;

comparing the logic state of said first input bit to the logic state of said second input bit;

providing said word_write current, and, simultaneously:

if the logic state of said first input bit is the same as the logic state of said second input bit, then, depending upon the logic state of said first and second input bits:

providing a first bit_write current in a selected one of said first and second directions to said first cell; and providing a second bit_write current in said selected one of said first and second directions to said second cell; but if the logic state of said first input bit is different from the logic state of said second input bit, then, depending upon the logic state of said first input bit, providing said first bit_write current in a selected one of said first and second directions to said first cell, and in the other of said first and second directions to said second cell.

2. The method of claim 1 wherein each of said first and second MRAM cells includes:

a bit-write line having a first end and a second end, said first direction being from said first end to said second end, and said second direction being from said second end to said first end;

wherein the MRAM system includes:

a first current switch to selectively connect the second end of the first bit-write line to the second end of the second bit-write line to form a first folded bit-write line having a first end comprising said first end of said first bit-write line and a second end comprising said first end of said second bit-write line, a third direction being from said first end of said first folded bit-write line to said second end thereof; and a second current switch to selectively connect the first end of the first bit-write line to the first end of the second bit-write line to form a first folded bit-write line having a first end comprising said second end of said first bit-write line and a second end comprising said second end of said second bit-write line, a fourth direction being from said first end of said second folded bit-write line to said second end thereof; and wherein said step of providing said third bit-write current comprises the steps of:

depending on a random condition:

enabling a selected one of said first and second current switches to connect the respective ends of said first and second bit-write lines to form a selected one of said first and second folded bit-write lines; and providing said first bit-write current in a selected one of said third and fourth directions on said selected folded bit-write line.

3. The method of claim 2 wherein:

a fifth direction is from said second end of said first folded bit-write line to said first end thereof; and a sixth direction is from said second end of said second folded bit-write line to said first end thereof; and wherein the steps of providing said first and second bit-write currents are further characterized as comprising a single step of:

providing a selected one of said first and second bit-write currents in a selected one of said third, fourth, fifth and sixth directions on said selected folded bit-write line.

4. The method of claim 2 wherein said random condition is the logic state of a selected one of said first and second input bits.

5. In an integrated circuit (IC) magnetic random access memory (MRAM) system having at least one word consisting of first and second data bits, said first data bit comprising a first MRAM cell and said second data bit comprising a second MRAM cell, each of said cells being writeable in a selected one of a first and a second logic state in response to a coincidence of a word_write current and a bit_write current, wherein the logic state to which said cell is writeable is determined by the direction of said bit_write current, and wherein said bit_write current is provided in a first direction to write said data bit to said first logic state and in a second direction to write said data bit to said second logic state, a write control circuit comprising:

an input circuit which receives first and second input bits, each having one of said first and second logic states;

a word_write driver circuit which, when enabled, provides said word_write current;

a first bit_write driver circuit which, when enabled, provides said bit_write current in a selected one of said first and second directions on said first bit-write line;

a second bit_write driver circuit which, when enabled, provides said bit_write current in selected one of said first and second directions on said second bit-write line;

a first current switch which, when enabled, selectively connects the second end of the first bit-write line to the second end of the second bit-write line to form a first folded bit-write line having a first end comprising said first end of said first bit-write line and a second end comprising said first end of said second bit-write line, a third direction being from said first end of said first folded bit-write line to said second end thereof;

a second current switch which, when enabled, selectively connects the first end of the first bit-write line to the first end of the second bit-write line to form a second folded bit-write line having a first end comprising said second end of said first bit-write line and a second end comprising said second end of said second bit-write line, a fourth direction being from said first end of said second folded bit-write line to said second end thereof; and a comparison circuit to compare the logic state of said first input bit to the current logic state of said second input bit, and:

if the logic state of said first input bit is the same as the logic state of said second input bit, then, depending upon the logic state of said first and second input bits, to:

disable said first and second current switches;

enable said first bit-write driver circuit to provide said first bit_write current in a selected one of said first and second directions on said first bit-write line; and enable said second bit-write driver circuit to provide said second bit_write current in a selected one of said first and second directions on said second bit-write line; but if the logic state of said first input bit is different from the logic state of said second input bit, then, depending upon the logic state of said first input bit, to:

enable a selected one of said first and second current switches to connect the respective ends of said first and second bit-write lines to form a selected one of said first and second folded bit-write lines; and enable said first bit-write driver circuit to provide said first bit-write current in a selected one of said third and fourth directions on said selected folded bit-write line.

6. The integrated circuit of claim 5 wherein:

a fifth direction is from said second end of said first folded bit-write line to said first end thereof; and a sixth direction is from said second end of said second folded bit-write line to said first end thereof; and wherein, if the logic state of said first input bit is different from the logic state of said second input bit, then, depending upon the logic state of said first input bit, the comparison circuit:

enables a selected one of said first and second current switches to connect the respective ends of said first and second bit-write lines to form a selected one of said first and second folded bit-write lines; and enables a selected one of said first and second bit-write driver circuits to provide a respective one of said first and second bit-write currents in a selected one of said third, fourth, fifth and sixth directions on said selected folded bit-write line.

7. The integrated circuit of claim 5 wherein:

a fifth direction is from said second end of said first folded bit-write line to said first end thereof; and a sixth direction is from said second end of said second folded bit-write line to said first end thereof; and wherein, if the logic state of said first input bit is different from the logic state of said second input bit, then, depending upon a random condition, the comparison circuit:

enables a selected one of said first and second current switches to connect the respective ends of said first and second bit-write lines to form a selected one of said first and second folded bit-write lines; and enables a selected one of said first and second bit-write driver circuits to provide a respective one of said first and second bit-write currents in a selected one of said third, fourth, fifth and sixth directions on said selected folded bit-write line.

8. In an integrated circuit (IC) magnetic random access memory (MRAM) system having at least one word consisting of first and second data bits, said first data bit comprising a first MRAM cell and said second data bit comprising a second MRAM cell, each of said cells being writeable in a selected one of a first and a second logic state in response to a coincidence of a word_write current and a bit_write current, wherein the logic state to which said cell is writeable is determined by the direction of said bit_write current, and wherein said bit_write current is provided in a first direction to write said data bit to said first logic state and in a second direction to write said data bit to said second logic state, a write control circuit comprising:

an input circuit which receives first and second input bits, each having one of said first and second logic states;

a word_write driver circuit which, when enabled, provides said word_write current;

a first bit_write driver circuit which, when enabled, provides said bit_write current in a selected one of said first and second directions on said first bit-write line;

a second bit_write driver circuit which, when enabled, provides said bit_write current in selected one of said first and second directions on said second bit-write line;

a current switch which, when enabled, selectively connects the second end of the first bit-write line to the second end of the second bit-write line to form a folded bit-write line having a first end comprising said first end of said first bit-write line and a second end comprising said first end of said second bit-write line, a third direction being from said first end of said folded bit-write line to said second end thereof and a fourth direction being from said second end of said folded bit-write line to said first end thereof;

a comparison circuit to compare the logic state of said first input bit to the current logic state of said second input bit, and:

if the logic state of said first input bit is the same as the logic state of said second input bit, then, depending upon the logic state of said first and second input bits, to:

disable said first current switch;

enable said first bit-write driver circuit to provide said first bit_write current in a selected one of said first and second directions on said first bit-write line; and enable said second bit-write driver circuit to provide said second bit_write current in a selected one of said first and second directions on said second bit-write line; but if the logic state of said first input bit is different from the logic state of said second input bit, then, depending upon the logic state of said first input bit, to:

enable said first current switch to connect the respective ends of said first and second bit-write lines to form said folded bit-write line; and enable said first bit-write driver circuit to provide said first bit-write current in a selected one of said third and fourth directions on said selected folded bit-write line.

9. The integrated circuit of claim 8 wherein, if the logic state of said first input bit is different from the logic state of said second input bit, then, depending upon a random condition, the comparison circuit:

enables said first current switch to connect the respective ends of said first and second bit-write lines to form said folded bit-write line; and enables a selected one of said first and second bit-write driver circuits to provide a respective one of said first and second bit-write currents in a selected one of said third and fourth directions on said selected folded bit-write line.

10. The integrated circuit of claim 9 wherein said random condition is the logic state of a selected one of said first and second input bits.

* * * * *

UNITED STATES PATENT AND TRADEMARK OFFICE
CERTIFICATE OF CORRECTION

| | |
|---|---|
| PATENT NO. | : 6,215,707 B1 |
| DATED | : April 10, 2001 |
| INVENTOR(S) | : William C. Moyer |

It is certified that error appears in the above-identified patent and that said Letters Patent is hereby corrected as shown below:

<u>Column 7, claim 2,</u>
Line 60, replace "first" with -- second --.

Signed and Sealed this

Nineteenth Day of February, 2002

*Attest:*

JAMES E. ROGAN
*Attesting Officer*     *Director of the United States Patent and Trademark Office*